United States Patent
Konishi et al.

(10) Patent No.: US 9,966,522 B2
(45) Date of Patent: May 8, 2018

(54) LIGHT-EMITTING DEVICE SUBSTRATE, LIGHT-EMITTING DEVICE, AND METHOD FOR MANUFACTURING LIGHT-EMITTING DEVICE SUBSTRATE

(71) Applicant: Sharp Kabushiki Kaisha, Sakai, Osaka (JP)

(72) Inventors: Masahiro Konishi, Sakai (JP); Shin Itoh, Sakai (JP); Hiroyuki Nokubo, Sakai (JP); Yoshiaki Itakura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days. days.

(21) Appl. No.: 15/303,570

(22) PCT Filed: Mar. 24, 2015

(86) PCT No.: PCT/JP2015/058977
§ 371 (c)(1),
(2) Date: Oct. 12, 2016

(87) PCT Pub. No.: WO2015/163075
PCT Pub. Date: Oct. 29, 2015

(65) Prior Publication Data
US 2017/0040519 A1 Feb. 9, 2017

(30) Foreign Application Priority Data

Apr. 23, 2014 (JP) .................................. 2014-089618

(51) Int. Cl.
*H01L 33/64* (2010.01)
*H01L 33/60* (2010.01)
(Continued)

(52) U.S. Cl.
CPC ............ *H01L 33/641* (2013.01); *H01L 33/46* (2013.01); *H01L 25/0753* (2013.01); *H01L 33/60* (2013.01);
(Continued)

(58) Field of Classification Search
CPC ....... H01L 33/641; H01L 33/60; H01L 33/62; H01L 33/64; H01L 25/0753; H01L 2224/48091; H01L 2224/48137; H01L 2933/0033; H01L 2224/0058; H01L 2224/0075
(Continued)

(56) References Cited

U.S. PATENT DOCUMENTS

| 2005/0207165 A1* | 9/2005 | Shimizu | .................. F21L 4/00 362/362 |
| 2014/0327024 A1* | 11/2014 | Ishihara | ................ H01L 24/97 257/98 |
| 2015/0316242 A1* | 11/2015 | Konishi | .................. F21K 9/00 362/382 |

FOREIGN PATENT DOCUMENTS

| CN | 103327732 A | 9/2013 |
| JP | 59-149958 A | 8/1984 |

(Continued)

*Primary Examiner* — Cuong Q Nguyen
*Assistant Examiner* — Tong-Ho Kim
(74) *Attorney, Agent, or Firm* — Keating & Bennett, LLP

(57) ABSTRACT

A substrate includes a base made of a metal material, a thermally conductive, light-reflective ceramic insulating layer, and a buffer layer formed between the base and the ceramic insulating layer and having a smaller linear expansion coefficient than the base.

11 Claims, 5 Drawing Sheets

(51) Int. Cl.
*H01L 25/075* (2006.01)
*H01L 33/62* (2010.01)
*H01L 33/46* (2010.01)

(52) U.S. Cl.
CPC .... *H01L 33/62* (2013.01); *H01L 2224/48091* (2013.01); *H01L 2224/48137* (2013.01); *H01L 2933/0033* (2013.01); *H01L 2933/0058* (2013.01); *H01L 2933/0075* (2013.01)

(58) Field of Classification Search
USPC .......................................... 257/98; 362/362
See application file for complete search history.

(56) References Cited

FOREIGN PATENT DOCUMENTS

| | | |
|---|---|---|
| JP | 1-156056 A | 6/1989 |
| JP | 2006-66822 A | 3/2006 |
| JP | 2007-194523 A | 8/2007 |
| JP | 2012-222228 A | 11/2012 |

\* cited by examiner

301: LIGHT-EMITTING DEVICE
302: BASE
303: ELECTRODE PATTERN
304: LIGHT-EMITTING ELEMENT
305: LIGHT-REFLECTIVE RESIN FRAME
306: PHOSPHOR-CONTAINING SEALING RESIN
307: ANODE
308: CATHODE
309: ANODE MARK
310: CATHODE MARK
320: SUBSTRATE

302: BASE
303: ELECTRODE PATTERN
304: LIGHT-EMITTING ELEMENT
311: INTERMEDIATE LAYER
312: REFLECTIVE LAYER
320: SUBSTRATE
250: BUFFER LAYER

LIGHT-EMITTING DEVICE SUBSTRATE, LIGHT-EMITTING DEVICE, AND METHOD FOR MANUFACTURING LIGHT-EMITTING DEVICE SUBSTRATE

TECHNICAL FIELD

The present invention relates to light-emitting device substrates including a base made of a metal material and a ceramic-containing insulating layer that reflects light, light-emitting devices including such light-emitting device substrates, and methods for manufacturing such light-emitting device substrates.

BACKGROUND ART

There are known light-emitting devices including a substrate and light-emitting elements provided thereon, such as light-emitting devices including a ceramic substrate and light-emitting devices including a metal substrate and an organic resist layer disposed thereon as an insulating layer.

PTL 1 discloses a technique for forming a laminate with high tracking resistance by spraying a ceramic onto one surface of a copper foil to form a ceramic layer, applying an adhesive to the ceramic layer, and laminating a sheet of paper impregnated with a phenolic resin on the surface coated with the adhesive.

PTL 2 discloses a thermoelectric transducer including a metal substrate having an insulating coating formed from a ceramic coating composition.

PTL 3 discloses a technique for forming an insulating coating by applying a ceramic coating composition to a base such as an aluminum base.

CITATION LIST

Patent Literature

PTL 1: Japanese Unexamined Patent Application Publication No. 1-156056 (published on Jun. 19, 1989)
PTL 2: Japanese Unexamined Patent Application Publication No. 2006-66822 (published on Mar. 9, 2006)
PTL 3: Japanese Unexamined Patent Application Publication No. 59-149958 (published on Aug. 28, 1984)

SUMMARY OF INVENTION

Technical Problem

The fabrication of high-power light-emitting devices requires good heat dissipation from components such as light-emitting elements. Since ceramic substrates, which are conventionally used, have low thermal conductivity, metal substrates, which have a higher thermal conductivity, need to be used. To mount light-emitting elements on a metal substrate, however, an insulating layer has to be formed on the metal substrate for pattern formation. In addition to high thermal conductivity, the insulating layer requires high light reflectivity to improve the availability of light from the light-emitting device.

Unfortunately, organic resists, which are conventionally used for insulating layers on light-emitting device substrates, have insufficient thermal conductivity, heat resistance, and light resistance. To improve the light availability, light needs to be reflected so that it does not leak through the insulating layer toward the substrate; however, conventional organic resist insulating layers have insufficient light reflectivity.

If a metal base, such as an aluminum base, on which an electrically insulating layer is formed by applying a conventional organic resist or ceramic coating composition is used as a light-emitting device substrate, particularly for high-power applications, the metal base undergoes repeated expansion and contraction due to heat generated from light-emitting elements mounted on the light-emitting device substrate. This produces a mechanical load on the electrically insulating layer formed on the metal base due to factors such as the difference in linear expansion coefficient between the electrically insulating layer and the metal base, thus causing problems such as separation of the electrically insulating layer and a decrease in dielectric strength. Another problem is that the life of the light-emitting elements mounted on the light-emitting device substrate is shortened by exposure to heat due to factors such as the difference in linear expansion coefficient between the electrically insulating layer and the metal base.

In view of the foregoing problems, an object of the present invention is to provide a high-brightness light-emitting device substrate that includes a metal base and an electrically insulating layer formed thereon and that maintains good adhesion between the metal base and the electrically insulating layer and high dielectric strength after exposure to heat, that is, to provide a reliable light-emitting device substrate.

Another object of the present invention is to provide a light-emitting device including a light-emitting element disposed on the light-emitting device substrate, that is, on the electrically insulating layer formed on the metal base, with improved heat dissipation performance, dielectric strength, and light availability.

Still another object of the present invention is to provide a method for manufacturing a high-brightness light-emitting device substrate with high heat dissipation performance, high dielectric strength, and high light availability.

Solution to Problem

To solve the foregoing problems, a light-emitting device substrate according to one aspect of the present invention includes a base made of a metal material, a thermally conductive, light-reflective electrically insulating layer, and a buffer layer formed between the base and the electrically insulating layer and having a smaller linear expansion coefficient than the base.

A light-emitting device according to one aspect of the present invention includes the light-emitting device substrate according to the above aspect of the present invention and a light-emitting element disposed on the electrically insulating layer.

A method for manufacturing a light-emitting device substrate according to one aspect of the present invention is a method for manufacturing the light-emitting device substrate according to the above aspect of the present invention. This method includes forming the buffer layer on the base by thermal spraying or aerosol deposition (AD) and applying a ceramic coating composition to the buffer layer to form the thermally conductive, light-reflective electrically insulating layer.

A method for manufacturing a light-emitting device substrate according to another aspect of the present invention is a method for manufacturing the light-emitting device substrate according to the above aspect of the present invention.

This method includes laminating a resin sheet containing ceramic particles on the base to form the buffer layer, laminating another resin sheet containing ceramic particles on the buffer layer to form a thermally conductive first ceramic layer, and applying a ceramic coating composition to the first ceramic layer to form a light-reflective second ceramic layer.

Advantageous Effects of Invention

Some aspects of the present invention have the advantage of providing a light-emitting device substrate with good adhesion between a metal base and an electrically insulating layer and high dielectric strength, that is, a reliable light-emitting device substrate, a light-emitting device including such a light-emitting device substrate, and a method for manufacturing such a light-emitting device substrate.

DESCRIPTION OF EMBODIMENTS

[First Embodiment]

An embodiment of the present invention will now be described.

(Construction of Light-Emitting Device 30 and Substrate 120)

FIG. 1(a) is a top view showing an example construction of a light-emitting device 30 according to this embodiment, and FIG. 1(b) is a sectional view taken along cross-section A-A in FIG. 1(a).

Figure 1:
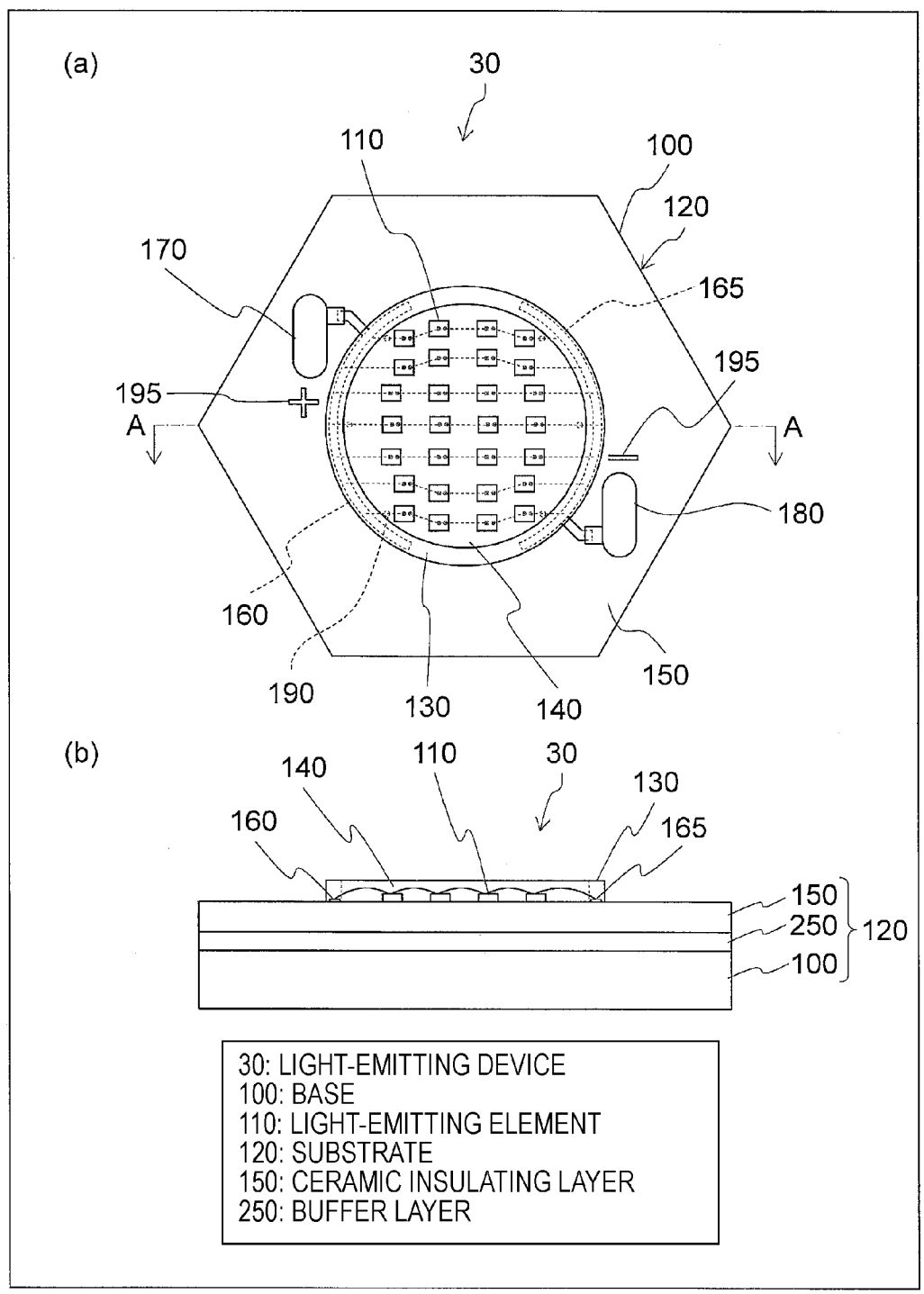
FIG. 1(a) is a top view of a light-emitting device according to a first embodiment.
FIG. 1(b) is a sectional view taken along cross-section A-A in FIG. 1(a).

As shown in FIG. 1, the light-emitting device 30 includes a substrate (light-emitting device substrate) 120, light-emitting elements 110, a light-reflective resin frame 130, and a sealing resin 140. The substrate 120 includes a base 100 made of a metal material, a thermally conductive, light-reflective ceramic insulating layer 150 (electrically insulating layer) having a single-layer structure, and a buffer layer 250 formed between the base 100 and the ceramic insulating layer 150 and having a smaller linear expansion coefficient than the base 100.

(Construction of Base 100)

The base 100 is made of a material with high thermal conductivity. The base 100 may be made of any material with high thermal conductivity, for example, a metal base containing a metal such as aluminum, copper, stainless steel, or iron. In this embodiment, an aluminum base is used, which is inexpensive, is easy to process, and is resistant to atmospheric moisture. Although the substrate 120 used in this embodiment is hexagonal, it need not be hexagonal, but may be of other shapes, including other polygons such as triangles, rectangles, pentagons, and octagons as well as circles and ovals.

(Construction of Buffer Layer 250)

The buffer layer 250 is formed on one surface of the base 100 by thermal spraying or aerosol deposition (AD) and is made of a material having a smaller linear expansion coefficient than the base 100. Preferably, the buffer layer 250 has a larger linear expansion coefficient than the ceramic insulating layer 150. The buffer layer 250 has a thickness of 10 to 100 μm, preferably 20 to 30 μm.

The buffer layer 250, which has a smaller linear expansion coefficient than the base 100 and a larger linear expansion coefficient than the ceramic insulating layer 150, can be provided between the base 100 and the ceramic insulating layer 150 to considerably reduce a mechanical load transferred to the light-emitting elements 110 due to thermal expansion and contraction of the base 100. This improves the life and reliability of the light-emitting elements 110 and therefore the light-emitting device 30.

It is desirable that the buffer layer 250 be a metal or alloy layer. The metal or alloy layer used as the buffer layer 250 contains at least one metal having a small linear expansion coefficient, such as Ni, Ti, Co, Fe, Nb, Mo, Ta, or W.

If the base 100 is made of aluminum, it is desirable that the buffer layer 250 contain at least one of Ni, Ti, and Co, preferably Ni.

To improve the adhesion to the aluminum base 100, it is preferred that the buffer layer 250 be made of an alloy of nickel (Ni) and aluminum. If the buffer layer 250 is made of an alloy of nickel (Ni) and aluminum, it is desirable that the buffer layer 250 contain as much nickel as possible so that its linear expansion coefficient lies nearly midway between those of the aluminum base 100 and the ceramic insulating layer 150. Specifically, it is desirable that the buffer layer 250 contain 90% or more by weight nickel. As discussed later, the reason is that the linear expansion coefficient of nickel, i.e., $13.4 \times 10^{-6}/°C.$, is nearly equal to the intermediate value between the linear expansion coefficients of aluminum and alumina, which is a typical ceramic material, i.e., $15 \times 10^{-6}/°C.$ If the buffer layer 250 is made of an alloy of nickel and aluminum and contains 90% or more by weight nickel, it has a linear expansion coefficient of 13 to $16 \times 10^{-6}/°C.$, which is close to $15 \times 10^{-6}/°C.$ Although Ni has a relatively low melting point among these metals, its melting point is actually high, i.e., 1,455° C. Alloying Ni with Al reduces its melting point and thus reduces the temperature required to achieve a molten or semi-molten state. This is advantageous, for example, for forming a nickel layer by thermal spraying.

If the base 100 is made of aluminum and the ceramic insulating layer 150 is made of alumina, Ni is suitable as a material for the buffer layer 250 since its linear expansion coefficient lies nearly midway between those of aluminum and alumina.

The linear expansion coefficients of the metals mentioned above at room temperature are compared as follows: aluminum has a linear expansion coefficient of $23 \times 10^{-6}/°C.$, and nickel (Ni), titanium (Ti), and cobalt (Co) have smaller linear expansion coefficients than aluminum, namely, $13.4 \times 10^{-6}/°C.$, $8.6 \times 10^{-6}/°C.$, and $13.0 \times 10^{-6}/°C.$, respectively. In contrast, alumina, which is a typical ceramic material, has a linear expansion coefficient of 6 to $8 \times 10^{-6}/°C.$, that is, about $7 \times 10^{-6}/°C.$ Nickel (Ni) and cobalt (Co) are more suitable as metals for the buffer layer 250 since their linear expansion coefficients lie nearly midway between those of aluminum and ceramics.

Although the linear expansion coefficient of glass varies greatly depending on the composition, it is about 3 to $9 \times 10^{-6}/°C.$, which is relatively close to that of alumina.

(Construction of Ceramic Insulating Layer (Electrically Insulating Layer) 150)

The ceramic insulating layer 150 is formed on the surface of the buffer layer 250 facing away from the base 100 by printing and has electrical insulation properties, high light reflectivity, and high thermal conductivity.

The light-emitting elements 110, the light-reflective resin frame 130, and the sealing resin 140 are disposed on the ceramic insulating layer 150. An anode conductor 160, a cathode conductor 165, lands serving as an anode 170 and a cathode 180, alignment marks 190, and polarity marks 195 are directly formed on the ceramic insulating layer 150.

A protective element (not shown) may be formed on the ceramic insulating layer 150 and may be connected in parallel to circuits in which the light-emitting elements 110 are connected in series as a resistor for protecting the light-emitting elements 110 from electrostatic discharge. This protective element may be, for example, a printed resistor or Zener diode. If the protective element is a Zener diode, the Zener diode is die-bonded to the wiring pattern and is electrically connected to the desired wiring line by wire bonding. In this case, the Zener diode is connected in parallel to the circuits in which the light-emitting elements 110 are connected in series.

(Construction of Light-Emitting Elements 110)

The light-emitting elements 110 are semiconductor light-emitting elements such as light-emitting diodes (LEDs). In this embodiment, blue light-emitting elements are used, which have peak emission wavelengths of around 450 nm. The light-emitting elements 110, however, need not be blue light-emitting elements, but may be, for example, ultraviolet (near-ultraviolet) light-emitting elements, which have a peak emission wavelength of 390 to 420 nm. The use of ultraviolet (near-ultraviolet) light-emitting elements results in a higher luminous efficiency.

A plurality of (in this embodiment, 28) light-emitting elements 110 are mounted at predetermined positions on the ceramic insulating layer 150 so that a predetermined light intensity can be achieved. The electrical connections of the light-emitting elements 110 (e.g., to the anode conductor 160 and the cathode conductor 165) are made by wire bonding using wires. The wires may be, for example, gold wires.

(Construction of Light-Reflective Resin Frame 130)

The light-reflective resin frame 130 is an annular (arc-shaped) frame made of a silicone resin containing an alumina filler. The light-reflective resin frame 130, however, need not be made of a silicone resin, but may be made of any light-reflective insulating resin. In addition, the light-reflective resin frame 130 need not be annular (arc-shaped), but may be of any shape. The anode conductor 160, the cathode conductor 165, and the protective element may also be of any shape.

(Construction of Sealing Resin 140)

The sealing resin 140 is a sealing resin layer made of a resin that transmits light. The sealing resin 140 fills the area surrounded by the light-reflective resin frame 130 to seal members such as the ceramic insulating layer 150, the light-emitting elements 110, and the wires.

The sealing resin 140 may contain a phosphor. The phosphor is excited by primary light emitted from the light-emitting elements 110 to emit light having a longer wavelength than the primary light. The phosphor may be any suitable phosphor selected depending on, for example, the chromaticity of the desired white color. Examples of combinations of phosphors for neutral and warm white colors include combinations of YAG yellow phosphors with (Sr, Ca)AlSiN$_3$:Eu red phosphors and combinations of YAG yellow phosphors with CaAlSiN$_3$:Eu red phosphors. Examples of combinations of phosphors with high color rendering indices include combinations of (Sr,Ca)AlSiN$_3$:Eu red phosphors with Ca$_3$(Sc,Mg)$_2$Si$_3$O$_{12}$:Ce green phosphors. Other combinations of phosphors may also be used. YAG yellow phosphors may be used alone to achieve a pseudo-white color.

(Overview of Construction of Light-Emitting Device 30)

As described above, the light-emitting device 30 according to this embodiment includes the ceramic insulating layer 150, on which are directly formed the light-emitting elements 110, the electrodes (anode 170 and cathode 180) for connecting the light-emitting device 30 to external wiring (or to external equipment), the conductors (anode conductor 160 and cathode conductor 165) for connecting the light-emitting elements 110 to the electrodes (anode 170 and cathode 180), the light-reflective resin frame (light-reflective resin frame 130) surrounding the area where the light-emitting elements 110 are disposed, and the sealing resin 140 sealing the members (e.g., a portion of the ceramic insulating layer 150, the light-emitting elements 110, and the wires) disposed in the area surrounded by the frame (light-reflective resin frame 130).

(Method for Manufacturing Light-Emitting Device 30)

A method for manufacturing the light-emitting device 30 will now be described.

A buffer layer 250 having a thickness of 20 μm is first formed on one surface of an aluminum base 100 by thermal spraying or aerosol deposition (AD).

Thermal spraying is the process of depositing molten particles of a thermal spraying material heated to a molten or semi-molten state on a base surface by causing the molten particles to impinge at high speed on the base surface. The thermal spraying material is supplied in powder or wire form to the thermal spraying system. Thermal spraying processes include flame spraying, arc spraying, plasma spraying, and high-speed flame spraying, which differ in the method for heating the thermal spraying material.

AD is the technique of mixing fine or ultrafine feedstock particles prepared by other techniques in advance with a gas to form an aerosol and spraying it onto a substrate through a nozzle to form a coating.

The base surface may be roughened by a process such as blasting before the formation of the buffer layer 250 to improve the adhesion between the base 100 and the buffer layer 250.

A ceramic insulating layer 150 having a thickness of 100 μm is then formed on the buffer layer 250 by printing. Specifically, the ceramic insulating layer 150 is formed by printing a ceramic coating composition (with a thickness of 20 μm or more) on the surface of the buffer layer 250 facing away from the base 100, followed by drying and firing steps.

The ceramic coating composition is preferably a coating composition that exhibits electrical insulation properties, high thermal conductivity, and high light reflectivity after the firing step. The ceramic coating composition contains a binder for binding the ceramic coating composition to the buffer layer 250, a resin for facilitating printing, and a solvent for maintaining sufficient viscosity.

A typical preferred ceramic coating composition is a glass binder containing ceramic particles. The glass binder is a sol-like material that forms glass particles through a sol-gel reaction. The ceramic particles are made of, for example, zirconia, which has high light reflectivity. The ceramic particles may be mixed with silica as a reinforcing material for the ceramic insulating layer 150 formed by firing the ceramic coating composition.

The step of forming the ceramic insulating layer 150 from the ceramic coating composition through the sol-gel reaction of the glass binder involves applying a ceramic coating composition containing ceramic particles to the buffer layer 250 formed on the aluminum base 100 by a process such as screen printing or spraying and then synthesizing a glass by the sol-gel process to form the ceramic insulating layer 150. Although the glass binder used for the sol-gel process is typically fired at 200° C. to 500° C., firing at 400° C. to 500° C. is effective in reducing the pores in the resulting porous glass gel coating and thereby improving the insulation properties.

In this embodiment, a sol used for the synthesis of a glass through a sol-gel reaction is used as a binder for zirconia particles. The glass binder is applied to the buffer layer 250 by screen printing and is then dried at 200° C. to 300° C. and fired at 400° C. to 500° C. to form the ceramic insulating layer 150.

Instead of the sol-gel process, the ceramic insulating layer 150 may be formed by remelting low-melting-point glass particles held together with an organic binder to form a glass layer. The remelting of low-melting-point glass particles held together with an organic binder requires a temperature of at least 800° C. to 900° C. This temperature, however, exceeds the melting point of aluminum, which is used for the aluminum base 100, i.e., 660° C. The aluminum base 100 therefore needs to be alloyed with any suitable impurity so that it has a higher melting point. Whereas a low-melting-point glass can be fired if the base 100 is made of copper, which has a higher melting point than aluminum, i.e., 1,085° C., any suitable impurity may be added to the base 100 to increase its melting point.

A glass binder used for the sol-gel process is fired at 200° C. to 500° C., which is lower than the temperature required to fire a low-melting-point glass. If the ceramic insulating layer 150 is formed from a glass binder, the aluminum base 100 is not damaged during the manufacturing process as long as an appropriate temperature is selected. The aluminum base 100 is also not damaged if a resin binder is used.

Instead of a glass binder, the ceramic insulating layer 150 may be formed from a resin binder. The resin binder is made of a resin with high heat and light resistance and high transparency, specifically, an epoxy, silicone, polyimide, or fluoropolymer resin. If a resin is used, the aluminum base 100 is not damaged during the manufacturing process since it can be cured at low temperature, i.e., about 200° C. A glass binder is preferred, however, since it has a higher heat and light resistance and a higher thermal conductivity than a resin binder.

In addition to zirconia particles, typical ceramic materials with high light reflectivity include titanium oxide particles and alumina particles. Preferred ceramic materials with high thermal conductivity include aluminum nitride particles. Other ceramic materials with high light reflectivity or high thermal conductivity may also be used.

As used herein, the term "ceramic material" encompasses not only metal oxides, but also any insulating material that reflects light from light-emitting elements. The term "ceramic material" is used in a broad sense to cover all inorganic solid materials, including aluminum nitride. The ceramic material may be any stable inorganic solid material with good heat resistance and thermal conductivity or good light reflection/scattering properties. It is to be understood, however, that a ceramic material that absorbs light is not suitable for the outermost layer of the ceramic insulating layer 150 on which the light-emitting elements 110 are mounted, that is, on the side of the ceramic insulating layer 150 facing the light-emitting elements 110. Examples of insulating materials that are not suitable on the side of the ceramic insulating layer 150 where the light-emitting elements 110 are mounted include silicon nitride and silicon carbide, which are generally black.

The anode conductor 160, the cathode conductor 165, the lands serving as the anode 170 and the cathode 180, the alignment marks 190, and the polarity marks 195 are then formed on the ceramic insulating layer 150 by screen printing.

In this embodiment, a silver (Ag) layer having a thickness of 1.0 μm, a nickel (Ni) layer having a thickness of 2.0 μm, and a gold (Au) layer having a thickness of 0.3 μm are formed as the anode conductor 160, the cathode conductor 165, the alignment marks 190, and the polarity marks 195. A silver (Ag) layer having a thickness of 1.0 μm, a copper (Cu) layer having a thickness of 20 μm, a nickel (Ni) layer having a thickness of 2.0 μm, and a gold (Au) layer having a thickness of 0.3 μm are formed as the lands serving as the anode 170 and the cathode 180.

The light-emitting elements 110 are then bonded to the ceramic insulating layer 150 with a resin paste. The light-emitting elements 110 are connected together with wires and are electrically connected to the conductor 160 by wire bonding.

The light-reflective resin frame 130 is then formed around the area where the light-emitting elements 110 are mounted on the base 100, the anode conductor 160, and the cathode conductor 165. The light-reflective resin frame 130 may be formed by any method, including those conventionally known.

The area surrounded by the light-reflective resin frame 130 is then filled with the sealing resin 140 to seal the members such as the portion of the ceramic insulating layer 150 in that area, the light-emitting elements 110, and the wires.

The reflectance (for light with a wavelength of 450 nm) of the ceramic insulating layer 150 formed in this embodiment is about 4% higher than that of the aluminum base 100.

In this embodiment, the thickness of the ceramic insulating layer 150 is determined based on the reflectance and the dielectric strength. The ceramic insulating layer 150 may crack if it is too thick and may have insufficient reflectance and dielectric strength if it is too thin. To provide sufficient reflectance for visible light and sufficient insulation between the light-emitting elements 110 and the base 100 while preventing cracking, it is preferred that the ceramic insulating layer 150 formed on the buffer layer 250 has a thickness of 20 to 150 μm, more preferably 50 to 100 μm.

[Second Embodiment]

A second embodiment of the present invention will now be described. For illustration purposes, the members having the same functions as those described in the first embodiment are denoted by the same reference numerals and are not described herein.

Whereas the ceramic insulating layer 150 formed on the buffer layer 250 in the first embodiment has a single-layer structure, a ceramic insulating layer (electrically insulating layer) 150a formed on the buffer layer 250 in this embodiment has a multilayer structure including a plurality of ceramic layers 151a and 151b.

(Construction of Light-Emitting Device 10 and Substrate (Light-Emitting Device Substrate) 120a)

FIG. 2(a) is a top view showing an example construction of a light-emitting device 10 according to this embodiment, and FIG. 2(b) is a sectional view taken along cross-section B-B in FIG. 2(a).

Figure 2:
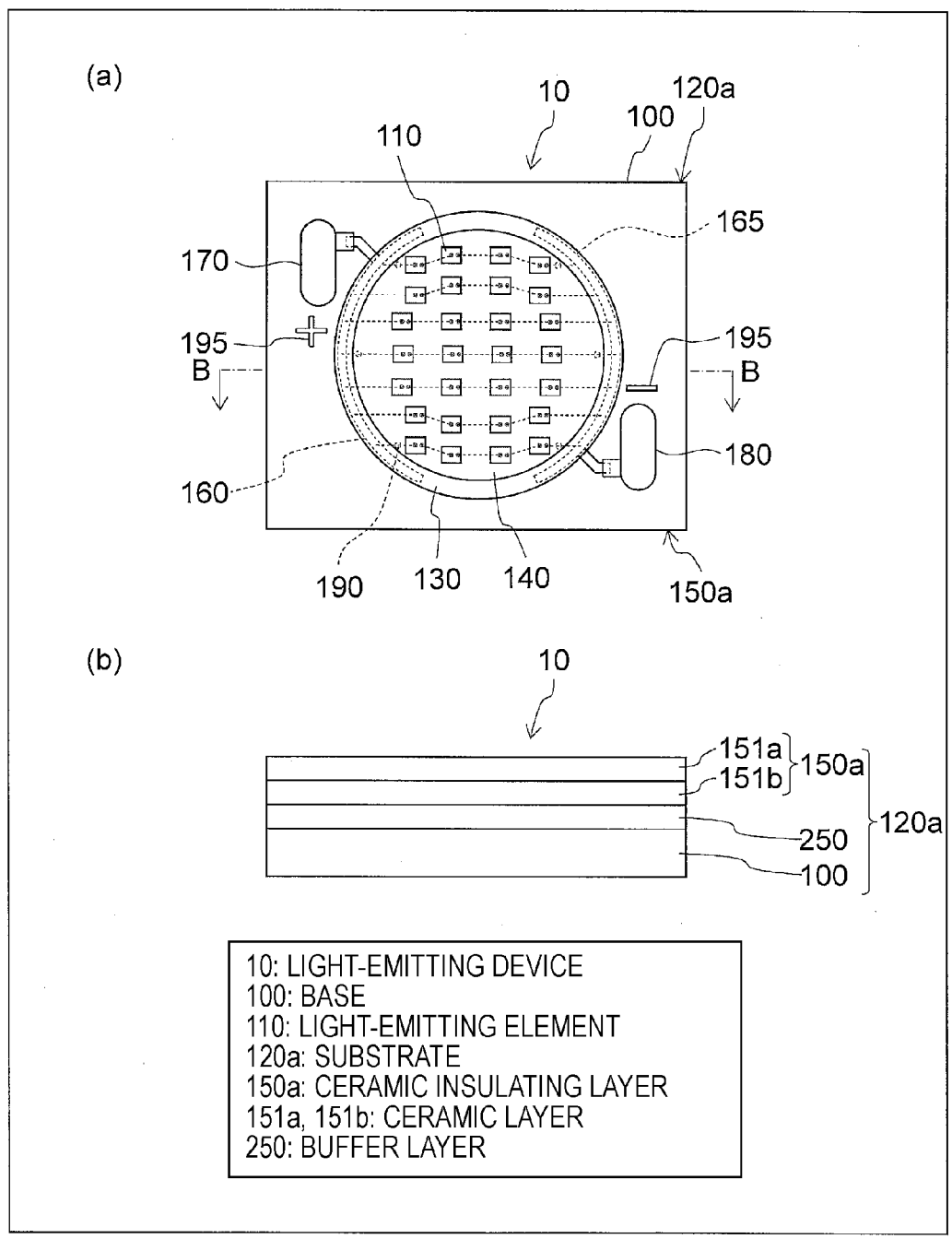
FIG. 2(a) is a top view of a light-emitting device according to a second embodiment.
FIG. 2(b) is a sectional view taken along cross-section B-B in FIG. 2(a).

As shown in FIG. 2, the light-emitting device 10 includes a substrate (light-emitting device substrate) 120a, light-emitting elements 110, a light-reflective resin frame 130, and a sealing resin 140. The substrate 120a includes a base 100 made of a metal material, a thermally conductive, light-reflective ceramic insulating layer 150a having a multilayer structure, and a buffer layer 250 formed between the base 100 and the ceramic insulating layer 150a and having a smaller linear expansion coefficient than the base 100. The ceramic insulating layer 150a includes a thermally conductive ceramic layer (first ceramic layer) 151b and a light-reflective ceramic layer (second ceramic layer) 151a.

The light-emitting device 10 has substantially the same construction as the light-emitting device 30 according to the first embodiment except that (i) the ceramic insulating layer 150a includes the ceramic layer (first ceramic layer) 151b, which has high thermal conductivity, and the ceramic layer (second ceramic layer) 151a, which has high light reflectivity, and that (ii) the base 100 is rectangular.

(Construction of Base 100)

The base 100 is made of a material with high thermal conductivity. The base 100 may be made of any material with high thermal conductivity, for example, a metal base containing a metal such as aluminum or copper. Alternatively, a metal base containing stainless steel or iron may be used, as mentioned in the first embodiment. In this embodiment, an aluminum base is used, as in the first embodiment.

(Construction of Buffer Layer 250)

The buffer layer 250 shown in FIG. 2 is similar to the buffer layer 250 described in the first embodiment and is therefore not described in detail herein.

(Construction of Ceramic Insulating Layer (Electrically Insulating Layer) 150a)

The ceramic insulating layer 150a has a multilayer structure including the high-thermal-conductivity ceramic layer 151b and the high-light-reflectivity ceramic layer 151a on the buffer layer 250. In this embodiment, these two different ceramic layers 151b and 151a are stacked together to form a multilayer structure so that the ceramic insulating layer 150 has high thermal conductivity and high light reflectivity. Preferably, the high-thermal-conductivity ceramic layer 151b is formed on the buffer layer 250, and the high-light-reflectivity ceramic layer 151a is formed on the high-thermal-conductivity ceramic layer 151b. Preferably, at least one of the high-thermal-conductivity ceramic layer 151b and the high-light-reflectivity ceramic layer 151a has electrical insulation properties.

The light-emitting elements 110, the light-reflective resin frame 130, and the sealing resin 140 are disposed on the ceramic insulating layer 150a. Other members such as an anode conductor 160, a cathode conductor 165, lands serving as an anode 170 and a cathode 180, alignment marks 190, and polarity marks 195 are directly formed on the ceramic insulating layer 150a.

A protective element (not shown) may be formed on the ceramic insulating layer 150a and may be connected in parallel to circuits in which the light-emitting elements 110 are connected in series as a resistor for protecting the light-emitting elements 110 from electrostatic discharge. This protective element may be, for example, a printed resistor or Zener diode. If the protective element is a Zener diode, the Zener diode is die-bonded to the wiring pattern and is electrically connected to the desired wiring line by wire bonding. In this case, the Zener diode is connected in parallel to the circuits in which the light-emitting elements 110 are connected in series.

The light-emitting elements 110 are semiconductor light-emitting elements such as light-emitting diodes (LEDs). In this embodiment, blue light-emitting elements are used, which have peak emission wavelengths of around 450 nm. The light-emitting elements 110, however, need not be blue light-emitting elements, but may be, for example, ultraviolet (near-ultraviolet) light-emitting elements, which have peak emission wavelengths of 390 to 420 nm. The use of ultraviolet (near-ultraviolet) light-emitting elements results in a higher luminous efficiency.

A plurality of (in this embodiment, 28) light-emitting elements 110 are mounted at predetermined positions on the high-light-reflectivity ceramic layer 151a so that a predetermined light intensity can be achieved. The electrical connections of the light-emitting elements 110 (e.g., to the anode conductor 160 and the cathode conductor 165) are made by wire bonding using wires. The wires may be, for example, gold wires.

The light-reflective resin frame 130 is an annular (arc-shaped) frame made of a silicone resin containing an alumina filler. The light-reflective resin frame 130, however, need not be made of a silicone resin, but may be made of any light-reflective insulating resin. In addition, the light-reflective resin frame 130 need not be annular (arc-shaped), but may be of any shape. The anode conductor 160, the cathode conductor 165, and the protective element may also be of any shape.

The sealing resin 140 is a sealing resin layer made of a resin that transmits light. The sealing resin 140 fills the area surrounded by the light-reflective resin frame 130 to seal members such as the ceramic insulating layer 150a, the light-emitting elements 110, and the wires.

The sealing resin 140 may contain a phosphor. The phosphor is excited by primary light emitted from the light-emitting elements 110 to emit light having a longer wavelength than the primary light. The phosphor may be any suitable phosphor selected depending on, for example, the chromaticity of the desired white color. Examples of combinations of phosphors for neutral and warm white colors include combinations of YAG yellow phosphors with (Sr, Ca)AlSiN$_3$:Eu red phosphors and combinations of YAG yellow phosphors with CaAlSiN$_3$:Eu red phosphors. Examples of combinations of phosphors for high color rendering indices include combinations of (Sr,Ca)AlSiN$_3$:Eu red phosphors with Ca$_3$(Sc,Mg)$_2$Si$_3$O$_{12}$:Ce green phosphors. Other combinations of phosphors may also be used. YAG yellow phosphors may be used alone to achieve a pseudo-white color.

(Method for Manufacturing Light-Emitting Device 10)

A method for manufacturing the light-emitting device 10 will now be described. FIGS. 3(a) to 3(d) illustrate the process of manufacturing the light-emitting device 10.

A buffer layer 250 having a thickness of 20 to 30 μm is first formed on one surface of an aluminum base 100 by thermal spraying or aerosol deposition (AD). A high-thermal-conductivity ceramic layer 151b having a thickness of 100 μnm is then formed on the buffer layer 250 by printing. Specifically, the high-thermal-conductivity ceramic layer 151b is formed by printing a ceramic coating composition (with a thickness of 20 μm or more) on one surface of the base 100, followed by drying and firing steps. The ceramic coating composition is a coating composition that exhibits high thermal conductivity after the firing step. The ceramic coating composition contains a binder for binding the ceramic coating composition to the buffer layer 250, a resin for facilitating printing, and a solvent for maintaining sufficient viscosity.

A high-light-reflectivity ceramic layer 151a having a thickness of 50 µm is then formed on the high-thermal-conductivity ceramic layer 151b by printing. Specifically, the high-light-reflectivity ceramic layer 151a is formed by printing a ceramic coating composition on the high-thermal-conductivity ceramic layer 151b (with a thickness of 20 µm or more), followed by drying and firing steps. The ceramic coating composition is a coating composition that exhibits high light reflectivity after the firing step. The ceramic coating composition contains a binder for binding the ceramic coating composition to the ceramic layer 151b, a resin for facilitating printing, and a solvent for maintaining sufficient viscosity.

Figure 3:
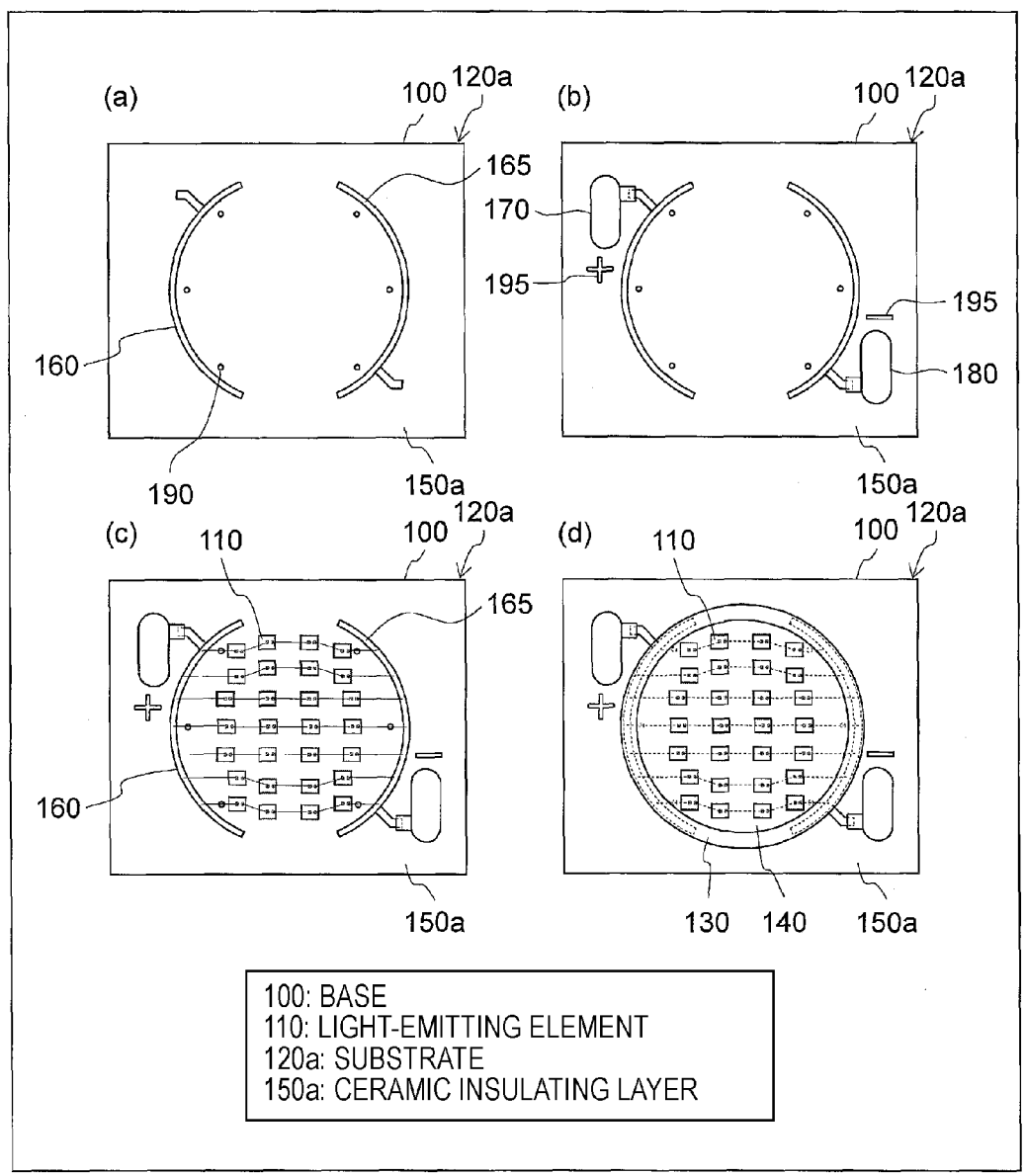
FIGS. 3(a) to 3(d) are top views illustrating a method for manufacturing the light-emitting device according to the second embodiment.

The anode conductor 160, the cathode conductor 165, and the alignment marks 190 are then formed on the ceramic insulating layer 150a (high-light-reflectivity ceramic layer 151a) by screen printing (see FIG. 3(a)). The lands serving as the anode 170 and the cathode 180 and the polarity marks 195 are then formed by screen printing (see FIG. 3(b)).

In this embodiment, a silver (Ag) layer having a thickness of 1.0 µm, a nickel (Ni) layer having a thickness of 2.0 µm, and a gold (Au) layer having a thickness of 0.3 µm are formed as the anode conductor 160, the cathode conductor 165, the alignment marks 190, and the polarity marks 195. A silver (Ag) layer having a thickness of 1.0 µm, a copper (Cu) layer having a thickness of 20 µm, a nickel (Ni) layer having a thickness of 2.0 µm, and a gold (Au) layer having a thickness of 0.3 µm are formed as the lands serving as the anode 170 and the cathode 180.

The light-emitting elements 110 are then bonded to the ceramic insulating layer 150a (high-light-reflectivity ceramic layer 151a) with a resin paste. The light-emitting elements 110 are connected together with wires and are electrically connected to the conductors 160 and 165 by wire bonding (see FIG. 3(c)).

The light-reflective resin frame 130 is then formed around the area where the light-emitting elements 110 are mounted on the base 100, the anode conductor 160, and the cathode conductor 165. The light-reflective resin frame 130 may be formed by any method, including those conventionally known.

The area surrounded by the light-reflective resin frame 130 is then filled with the sealing resin 140 to seal the members such as the portion of the ceramic insulating layer 150a in that area, the light-emitting elements 110, and the wires (see FIG. 3(d)).

The reflectance (for light with a wavelength of 450 nm) of the ceramic insulating layer 150a (high-light-reflectivity ceramic layer 151a) formed in this embodiment is about 4% higher than that of the aluminum base 100.

The high-light-reflectivity ceramic layer 151a and the high-thermal-conductivity ceramic layer 151b may crack if they are too thick and may have insufficient light reflectivity, thermal conductivity, and dielectric strength if they are too thin. In this embodiment, the high-light-reflectivity ceramic layer 151a and the high-thermal-conductivity ceramic layer 151b have thicknesses of 50 µm and 100 µm, respectively, which are intended to provide the required characteristics (high light reflectivity, high thermal conductivity, and high dielectric strength) while preventing cracking. It is to be understood, however, that either layer may be thicker than the other if one of high light reflectivity and high thermal conductivity is given priority over the other. In this embodiment, the ceramic layer 151b is thicker since high thermal conductivity is given priority. To provide the required characteristics while preventing cracking, it is preferred that the high-light-reflectivity ceramic layer 151a and the high-thermal-conductivity ceramic layer 151b each have a thickness of 20 to 150 µm, more preferably 50 to 100 µm. To prevent cracking more reliably, it is preferred that the high-light-reflectivity ceramic layer 151a and the high-thermal-conductivity ceramic layer 151b have a total thickness of 100 to 200 µm.

As described above, a light-emitting device substrate 120 or 120a according to one aspect of the present invention includes a base 100 made of a metal material, a thermally conductive, light-reflective ceramic insulating layer (electrically insulating layer) 150 or 150a, and a buffer layer 250 formed between the base 100 and the ceramic insulating layer 150 or 150a and having a smaller linear expansion coefficient than the base 100.

According to the above aspect, the ceramic insulating layer 150 or 150a, which has high dielectric strength, high thermal conductivity, and high light reflectivity, is formed on the metal base 100 with the buffer layer 250 therebetween. This improves the adhesion to the base 100 and thus provides a high-brightness substrate (light-emitting device substrate) 120 or 120a with high long-term reliability that does not suffer from problems such as separation of the ceramic insulating layer 150 or 150a and a decrease in dielectric strength.

Thus, the above aspect provides a light-emitting device 30 or 10 including light-emitting elements 110 mounted on the ceramic insulating layer 150 or 150a with high dielectric strength, high thermal conductivity, and high light reflectivity formed on the base 100 of the substrate 120 or 120a. The buffer layer 250, which has a smaller linear expansion coefficient than the metal base 100 and a larger linear expansion coefficient than the ceramic insulating layer 150 or 150a, can be provided between the base 100 and the ceramic insulating layer 150 or 150a to considerably reduce a mechanical load transferred to the light-emitting elements 110 due to thermal expansion and contraction of the base 100. This improves the life and reliability of the light-emitting elements 110 and therefore the light-emitting device 30 or 10.

Specifically, a light-emitting device including LEDs fabricated on sapphire substrates, serving as the light-emitting elements 110, and an alumina layer, serving as the ceramic insulating layer 150 or 150a, is discussed below. Since sapphire has a linear expansion coefficient of $7 \times 10^{-6}/°$ C., which is nearly equal to that of alumina, they undergo thermal expansion and contraction in synchronization. Therefore, the mechanical load on the light-emitting elements 110 due to thermal expansion and contraction of the ceramic insulating layer 150 or 150a is practically negligible. The mechanical load due to thermal expansion and contraction of the aluminum base 100, which has a linear expansion coefficient of $23 \times 10^{-6}/°$ C., is reduced by the buffer layer 250, which has a smaller linear expansion coefficient than the base 100, before being transferred to the ceramic insulating layer 150 or 150a. The mechanical load is further reduced by the ceramic insulating layer 150 or 150a before being transferred to the light-emitting elements 110. Thus, the mechanical load on the light-emitting elements 110 is considerably reduced.

[Third Embodiment]

A third embodiment of the present invention will now be described with reference to FIGS. 4 and 5.

(Construction of Light-Emitting Device 301 and Substrate (Light-Emitting Device Substrate) 320)

Figure 4:
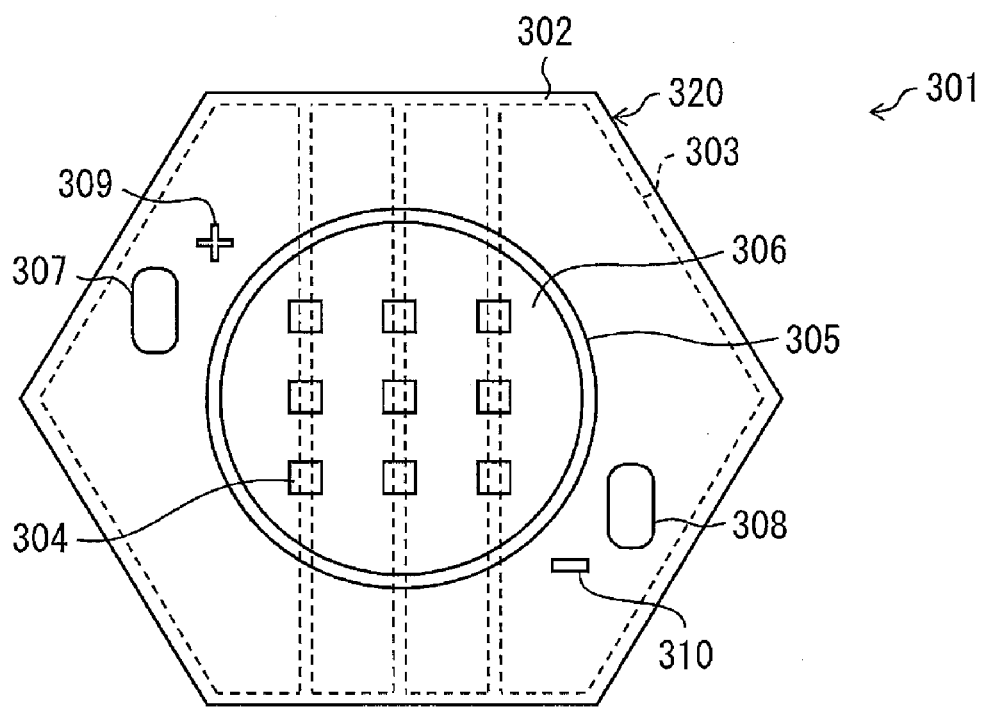
FIG. 4 is a top view of a light-emitting device according to a third embodiment.

FIG. 4 is a plan view showing the construction of a light-emitting device 301 according to a third embodiment. FIG. 5 is a sectional view showing the construction of a substrate (light-emitting device substrate) 320 and light-emitting elements 304 of the light-emitting device 301.

Figure 5:
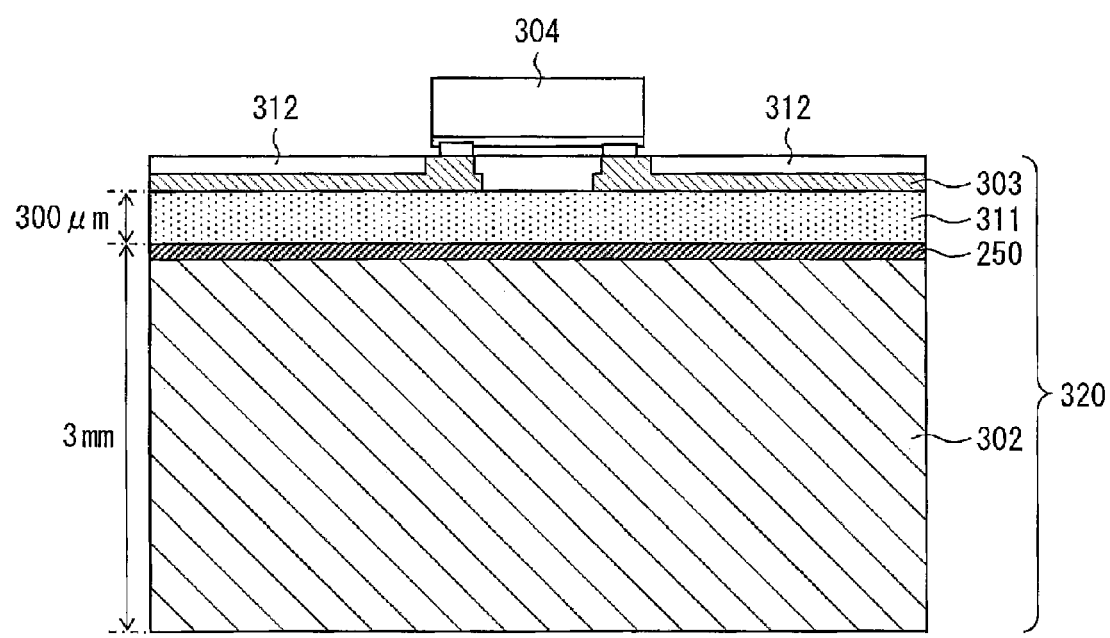
FIG. 5 is a sectional view of the light-emitting device according to the third embodiment.

As shown in FIGS. 4 and 5, the light-emitting device 301 includes the substrate 320 and the light-emitting elements 304. The substrate 320 includes a base 302, a buffer layer 250, an intermediate layer (first ceramic layer) 311 (shown in FIG. 5), an electrode pattern 303, and a reflective layer (second ceramic layer) 312 (shown in FIG. 5).

The light-emitting elements 304 are electrically connected to the electrode pattern 303. FIG. 4 illustrates nine light-emitting elements (LED chips) 304 arranged in three columns and three rows. The nine light-emitting elements 304 are arranged such that three series circuits of three light-emitting elements 304 are connected in parallel via the electrode pattern 303 (i.e., three in series by three in parallel). It is to be understood that there may be more or fewer light-emitting elements 304, and they may be connected in other ways.

The light-emitting device 301 further includes a light-reflective resin frame 305, a phosphor-containing sealing resin 306, an anode (anode land or connector) 307, a cathode (cathode land or connector) 308, an anode mark 309, and a cathode mark 310.

The light-reflective resin frame 305 is an annular (arc-shaped) frame disposed on the electrode pattern 303 and the reflective layer 312 and made of a silicone resin containing an alumina filler. The light-reflective resin frame 305, however, need not be made of a silicone resin, but may be made of any light-reflective insulating resin. In addition, the light-reflective resin frame 305 need not be annular (arc-shaped), but may be of any shape.

The phosphor-containing sealing resin 306 is a sealing resin layer made of a resin that transmits light. The phosphor-containing sealing resin 306 fills the area surrounded by the light-reflective resin frame 305 to seal the electrode pattern 303, the light-emitting elements 304, and the reflective layer 312. The phosphor-containing sealing resin 306 contains a phosphor. The phosphor is excited by primary light emitted from the light-emitting elements 304 to emit light having a longer wavelength than the primary light.

The phosphor may be any phosphor.

The anode 307 and the cathode 308 are electrodes that supply a current for driving the light-emitting elements 304 to the light-emitting elements 304 and are provided in the form of lands. Alternatively, the anode 307 and the cathode 308 may be provided in the form of connectors on the lands. The anode (anode land or connector) 307 and the cathode (cathode land or connector) 308 of the light-emitting device 301 can be connected to an external power supply (not shown). The anode (anode land or connector) 307 and the cathode (cathode land or connector) 308 are connected to the light-emitting elements 304 via the electrode pattern 303.

The anode mark 309 and the cathode mark 310 are alignment marks serving as references for positioning the anode (anode land or connector) 307 and the cathode (cathode land or connector) 308, respectively. The anode mark 309 and the cathode mark 310 also indicate the polarities of the anode (anode land or connector) 307 and the cathode (cathode land or connector) 308, respectively.

The electrode pattern 303 is thicker directly under the anode (anode land or connector) 307 and the cathode (cathode land or connector) 308 than in the remaining area (corresponding to the portion of the electrode pattern 303 covered by the reflective layer 312 in FIG. 5).

(Construction of Substrate 320)

The layers of the substrate 320 will now be described with reference to FIG. 5.

As shown in FIG. 5, the substrate 320 includes a base 302 made of a metal material, a buffer layer 250 formed on one surface of the base 302, a thermally conductive intermediate layer 311 formed on the buffer layer 250, an electrode pattern 303 formed on the intermediate layer 311, and a light-reflective layer 312 formed on the intermediate layer 311 and on part of the electrode pattern 303 such that part of the electrode pattern 303 is exposed.

A buffer layer 250 having a thickness of 20 to 30 μm is formed on one surface of an aluminum base 302 by thermal spraying or aerosol deposition (AD).

(Construction of Base 302)

The metal base 302 used in the third embodiment is an aluminum base. The aluminum base may have, for example, a length of 50 mm, a width of 50 mm, and a thickness of 3 mm. Aluminum has advantages such as low weight, good workability, and high thermal conductivity. The aluminum base may contain other constituents, provided that they do not interfere with anodic oxidation. In the third embodiment, the metal base 302 may be made of aluminum, which is a low-melting-point metal with a melting point of 660° C., since the buffer layer 250, the intermediate layer 311, the electrode pattern 303, and the light-reflective layer 312 can be formed on the base 302 at relatively low temperatures, as discussed in detail later. For the same reason, the base 302 need not be an aluminum base, but may be, for example, a copper base. A wide range of materials can be selected for the metal base 302.

It is to be understood that materials having higher melting points, such as iron and stainless steel (SUS), may be selected for the base 302.

(Construction of Buffer Layer 250)

The buffer layer 250 shown in FIG. 5 is similar to the buffer layer 250 described in the first embodiment and is therefore not described in detail herein.

(Construction of Intermediate Layer 311)

In this embodiment, as shown in FIG. 5, the intermediate layer 311, which is made of a thermally conductive ceramic insulating material, is formed between the metal base 302 and the electrode pattern 303 or the light-reflective layer 312 to stably provide high heat dissipation performance and high dielectric strength for the substrate (light-emitting device substrate) 320.

The intermediate layer 311 may be formed on the buffer layer 250 in the same manner as the ceramic insulating layer 150 illustrated in the first embodiment or the high-thermal-conductivity ceramic layer 151b illustrated in the second embodiment.

The interior of the intermediate layer 311 may optionally be composed of a plurality of layers.

(Construction of Electrode Pattern 303)

The electrode pattern 303 is formed on the intermediate layer 311, for example, by forming a plating layer on a metal paste serving as an underlying layer for electrodes.

The electrode pattern 303 is exposed in the areas corresponding to terminals electrically connected to the light-emitting elements 304, in the areas corresponding to the anode (anode land or connector) 307 and the cathode (cathode land or connector) 308, which are connected to external wiring or equipment, and in the areas corresponding to the anode mark 309 and the cathode mark 310. Alternatively, the anode mark 309 and the cathode mark 310 may be formed on the reflective layer 312.

The light-emitting device 301 may be connected to external wiring or equipment by soldering the anode 307 and the cathode 308 to the external wiring or equipment or via connectors connected to the anode (anode land or connector) 307 and the cathode (cathode land or connector) 308.

(Construction of Reflective Layer 312)

As shown in FIG. 5, the light-reflective layer 312 is formed on the intermediate layer 311 and on part of the electrode pattern 303 of the substrate 320 such that part of the electrode pattern 303 is exposed.

The reflective layer 312 is made of an insulating material that reflects light from the light-emitting elements 304. In the third embodiment, the reflective layer 312 may be formed in the same manner as the high-light-reflectivity ceramic layer 151a illustrated in the second embodiment.

In the third embodiment, the light-reflective layer 312 is an insulating layer containing zirconia particles, which are light-reflective ceramic particles. This insulating layer is formed by sintering a glass binder.

In the third embodiment, a sol used for the synthesis of a glass through a sol-gel reaction is used as a binder for zirconia particles. The glass binder is applied to the intermediate layer 311 and part the electrode pattern 303 by screen printing such that the remainder of the electrode pattern 303 is exposed. The glass binder is then dried at 200° C. to 300° C. and finally fired at 400° C. to 500° C. to form the light-reflective layer 312.

Alternatively, the light-reflective layer 312 may be formed by spraying. Specifically, the light-reflective layer 312 may be formed by spraying a feedstock, drying and firing the feedstock in the same manner as above, and polishing part of the reflective layer 312 to expose part of the electrode pattern 303.

A glass need not be formed by the sol-gel process, but may be formed, for example, by remelting low-melting-point glass particles held together with an organic binder to form a glass layer, as described above. Remelting requires a temperature of at least 800° C. to 900° C. If the reflective layer 312 is formed by this technique, it is desirable to form the intermediate layer 311 by the same technique.

Whereas it is preferred that the reflective layer 312 be made of a glass since a glass layer has high light and heat resistance, it may instead be made of a resin with high heat and light resistance. For example, the reflective layer 312 may be formed from a silicone, epoxy, fluoropolymer, or polyimide resin binder containing ceramic particles. Although resins have a lower heat and light resistance than glasses, they have the advantage that the forming process is easier since the curing temperature is lower than the temperature required to synthesize a glass by the sol-gel process.

In this way, the reflective layer 312 is formed from a glass or resin binder containing light-reflective ceramic particles.

The interior of the reflective layer 312 in this embodiment may optionally be composed of a plurality of layers.

In this case, the reflective layer 312 may include a layer with a higher thermal conductivity that is closer to the intermediate layer 311 and a layer with a higher light reflectivity that is farther away from the intermediate layer 311. This provides a light-emitting device substrate 320 with high reflectivity, high heat dissipation performance, high dielectric strength, and high long-term reliability, including high heat and light resistance. It is to be noted that the terms "higher thermal conductivity" and "higher light reflectivity" as used herein refer to a higher thermal conductivity and a higher light reflectivity, respectively, within the reflective layer 312.

(Construction of Light-Emitting Elements 304)

The light-emitting elements 304 shown in FIG. 5 are mounted and packaged on the substrate 320. In this example, the light-emitting elements 304 are electrically connected to the terminals of the electrode pattern 303 by flip-chip bonding. The electrical connections may be made by common techniques such as using solders, bumps, or metal pastes.

Although the light-emitting elements 304 used in the third embodiment are LEDs, they need not be LEDs, but may be other light-emitting elements such as EL elements.

In the third embodiment, the light-emitting elements 304 are fabricated on sapphire substrates.

[Fourth Embodiment]

The buffer layer 250 used for any of the substrates (light-emitting device substrates) 120, 120a, and 320 illustrated in the first to third embodiments need not be made of a metal or alloy, but may instead be formed from a resin sheet or resin paste.

In particular, it is preferred to form the buffer layer 250 from a resin sheet or resin paste if the ceramic insulating layer (electrically insulating layer) 150 illustrated in the first embodiment, the high-thermal-conductivity ceramic layer (first ceramic layer) 151b illustrated in the second embodiment, or the intermediate layer (first ceramic layer) 311 illustrated in the third embodiment is formed from a resin binder containing ceramic particles such as alumina particles or a resin sheet containing ceramic particles such as alumina particles, rather than a glass binder containing ceramic particles.

In this case, additives may optionally be added to the resin to adjust the physical properties, such as thermal conductivity and linear expansion coefficient, of the buffer layer 250. Examples of such additives include ceramic particles (alumina particles), glass fiber, and metal particles.

Such additives may also be added to the ceramic insulating layer 150, the high-thermal-conductivity ceramic layer (first ceramic layer) 151b, and the intermediate layer 311 described above, and they may be formed from a resin paste containing a suitable combination of ceramic particles and glass fiber. To improve the dielectric strength, however, it is preferred not to add metal particles.

If the ceramic insulating layer 150 illustrated in the first embodiment is formed from a resin binder or resin sheet, a resin with high heat and light resistance and high transparency, specifically, an epoxy, silicone, polyimide, or fluoropolymer resin, is used to form the ceramic insulating layer 150.

The high-thermal-conductivity ceramic layer (first ceramic layer) 151b illustrated in the second embodiment and the intermediate layer (first ceramic layer) 311 illustrated in the third embodiment are covered by the high-light-reflectivity ceramic layer 151a and the reflective layer 312, respectively. Such ceramic layers do not require light resistance or transparency and may be made of a resin with high heat resistance, specifically, an epoxy, silicone, polyimide, or fluoropolymer resin.

For the same reason, the buffer layer 250 does not require light resistance or transparency and may be made of a resin with high heat resistance, specifically, an epoxy, silicone, polyimide, or fluoropolymer resin.

More specifically, the buffer layer 250 may be a commercially available heat-dissipating substrate insulating sheet (Product No. BUR-5590), and the high-thermal-conductivity ceramic layer (first ceramic layer) 151b illustrated in the second embodiment and the intermediate layer 311 illustrated in the third embodiment may be other commercially available thermally conductive adhesive sheets. If the electrode pattern 303 is formed on the intermediate layer 311, as in the third embodiment, the electrode pattern 303 may be formed, for example, by laminating a copper foil on the intermediate layer 311 to form a conductive layer and then etching the conductive layer.

The commercially available heat-dissipating substrate insulating sheet used for the buffer layer 250 is formed from an epoxy resin binder containing ceramic particles and has a linear expansion coefficient of 10 to $15 \times 10^{-6}$/° C. Although the other commercially available thermally conductive adhesive sheets used for the ceramic layer (first ceramic layer) 151b and the intermediate layer 311 are similarly formed from an epoxy resin binder containing ceramic particles, the composition thereof is adjusted to achieve a linear expansion coefficient of $6 \times 10^{-6}$/° C. If the base 100 illustrated in the second embodiment or the base 302 illustrated in the third embodiment is made of aluminum, which has a linear expansion coefficient of $23 \times 10^{-6}$/° C., the linear expansion coefficients of the individual layers are as follows, in order from bottom to top: the aluminum base 100 or 302 has a linear expansion coefficient of $23 \times 10^{-6}$/° C., the buffer layer 250 has a linear expansion coefficient of 10 to $15 \times 10^{-6}$/° C., and the high-thermal-conductivity ceramic layer (first ceramic layer) 151b or the intermediate layer 311 has a linear expansion coefficient of $6 \times 10^{-6}$/° C. Thus, the linear expansion coefficient of the buffer layer 250 lies midway between those of the layers above and below the buffer layer 250.

The commercially available heat-dissipating substrate insulating sheet and the other commercially available thermally conductive adhesive sheets, both of which are formed from an epoxy resin binder containing ceramic particles, have high thermal conductivity, i.e., 5 W/(m·K), and high dielectric strength, i.e., 5 kV or more for a thickness of 100 µm. Thus, insulating layers, including the buffer layer 250, can be provided that have high thermal conductivity and high dielectric strength and that are suitable for use as electrically insulating layers on high-brightness illumination substrates.

As discussed above, if the buffer layer 250, the ceramic layer 151b, or the intermediate layer 311 is a resin layer, it is desirable to form the high-light-reflectivity ceramic layer 151a or the reflective layer 312a from a resin binder containing ceramic particles. If a glass binder is used, it needs to be dried and fired at 300° C. or lower, preferably 250° C. or lower, to reduce thermal damage to resin layers such as the buffer layer 250.

[Summary]

A light-emitting device substrate (substrate 120, 120a, or 320) according to a first aspect of the present invention includes a base 100 made of a metal material, a thermally conductive, light-reflective electrically insulating layer (ceramic insulating layer 150 or 150a, intermediate layer 311, or reflective layer 312), and a buffer layer 250 formed between the base 100 and the electrically insulating layer (ceramic insulating layer 150 or 150a, intermediate layer 311, or reflective layer 312) and having a smaller linear expansion coefficient than the base 100.

According to the above aspect, the buffer layer, which has a smaller linear expansion coefficient than the metal base, is disposed between the base and the thermally conductive, light-reflective electrically insulating layer. This improves the adhesion between the electrically insulating layer and the base and thus provides a high-brightness light-emitting device substrate with high long-term reliability that does not suffer from problems such as separation of the ceramic insulating layer and a decrease in dielectric strength.

In a second aspect of the present invention, the buffer layer 250 of the light-emitting device substrate (substrate 120, 120a, or 320) according to the first aspect may have a larger linear expansion coefficient than the electrically insulating layer (ceramic insulating layer 150 or 150a, intermediate layer 311, or reflective layer 312).

According to the above aspect, the buffer layer has a smaller linear expansion coefficient than the base and a larger linear expansion coefficient than the electrically insulating layer. This further improves the adhesion between the electrically insulating layer and the base.

In a third aspect of the present invention, the base 100 of the light-emitting device substrate according to the first aspect may contain aluminum, copper, stainless steel, or iron.

According to the above aspect, the thermal conductivity of the base can be improved.

In a fourth aspect of the present invention, the buffer layer 250 of the light-emitting device substrate according to the first aspect may be a metal or alloy layer.

According to the above aspect, the adhesion of the buffer layer to the base and the electrically insulating layer can be improved.

In a fifth aspect of the present invention, the metal or alloy layer serving as the buffer layer 250 of the light-emitting device substrate according to the fourth aspect may contain at least one of Ni, Ti, Co, Fe, Nb, Mo, Ta, and W.

According to the above aspect, the adhesion of the buffer layer to the base and the electrically insulating layer can be further improved.

In a sixth aspect of the present invention, the base 100 of the light-emitting device substrate according to the first aspect may be made of aluminum, and the buffer layer 250 may contain at least one of Ni, Ti, and Co.

According to the above aspect, the adhesion of the buffer layer to the base can be further improved if the base is made of aluminum.

In a seventh aspect of the present invention, the base 100 of the light-emitting device substrate according to the first aspect may be made of aluminum, and the buffer layer 250 may be made of an alloy of Ni and aluminum.

According to the above aspect, the adhesion between the aluminum base and the electrically insulating layer can be improved.

In an eighth aspect of the present invention, the buffer layer 250 of the light-emitting device substrate according to the seventh aspect may contain 90% or more by weight Ni.

According to the above aspect, the linear expansion coefficient of the buffer layer is close to that of the electrically insulating layer.

In a ninth aspect of the present invention, the buffer layer 250 of the light-emitting device substrate according to the seventh aspect may have a thickness of 10 to 100 µm.

According to the above aspect, the adhesion between the electrically insulating layer and the base is further improved.

In a tenth aspect of the present invention, the electrically insulating layer (ceramic insulating layer 150a, intermediate layer 311, or reflective layer 312) of the light-emitting device substrate according to the first aspect may have a multilayer structure including a plurality of layers. The layers of the electrically insulating layer may include a thermally conductive first ceramic layer (ceramic layer 151b or intermediate layer 311) that is in contact with the buffer layer and a light-reflective second ceramic layer (ceramic layer 151a or reflective layer 312) that is farthest away from the buffer layer. The first ceramic layer has a higher thermal conductivity than the second ceramic layer. The second ceramic layer has a higher light reflectivity than the first ceramic layer.

According to the above aspect, a thermally conductive, light-reflective electrically insulating layer can be provided in a simple manner.

In an eleventh aspect of the present invention, the buffer layer 250 of the light-emitting device substrate according to the first aspect may contain a resin.

In a twelfth aspect of the present invention, the resin used in the light-emitting device substrate according to the eleventh aspect may be an epoxy, silicone, polyimide, or fluoropolymer resin.

According to the above aspect, the buffer layer, which is covered by the electrically insulating layer, does not require light resistance or transparency and may be made of a resin with high heat resistance.

In a thirteenth aspect of the present invention, the resin used in the light-emitting device substrate according to the eleventh aspect may contain ceramic particles.

According to the above aspect, the physical properties, such as thermal conductivity and linear expansion coefficient, of the buffer layer can be adjusted.

In a fourteenth aspect of the present invention, the electrically insulating layer (ceramic insulating layer 150 or 150a, intermediate layer 311, or reflective layer 312) of the light-emitting device substrate according to the first aspect may be made of a resin containing ceramic particles.

In a fifteenth aspect of the present invention, the buffer layer and the electrically insulating layer of the light-emitting device substrate according to the first aspect may each contain an epoxy resin.

According to the above aspect, the heat resistance of the buffer layer and the electrically insulating layer can be improved.

In a sixteenth aspect of the present invention, the buffer layer and the electrically insulating layer of the light-emitting device substrate according to the first aspect may each be made of a resin containing alumina particles.

According to the above aspect, the physical properties of the buffer layer and the electrically insulating layer can be adjusted.

A light-emitting device 30, 10, or 301 according to a seventeenth aspect of the present invention includes the light-emitting device substrate (substrate 120, 120a, or 320) according to the first aspect and a light-emitting element 110 or 304 disposed on the electrically insulating layer (ceramic insulating layer 150 or 150a, intermediate layer 311, or reflective layer 312).

A method for manufacturing a light-emitting device substrate according to an eighteenth aspect of the present invention is a method for manufacturing the light-emitting device substrate (substrate 120, 120a, or 320) according to the first aspect. This method includes forming the buffer layer 250 on the base 100 or 302 by thermal spraying or aerosol deposition (AD) and applying a ceramic coating composition to the buffer layer 250 to form the thermally conductive, light-reflective electrically insulating layer (ceramic insulating layer 150 or 150a, intermediate layer 311, or reflective layer 312).

A method for manufacturing a light-emitting device substrate according to a nineteenth aspect of the present invention is a method for manufacturing the light-emitting device substrate (substrate 120a or 320) according to the tenth aspect. This method includes forming the buffer layer 250 on the base 100 or 302 by thermal spraying or aerosol deposition (AD), applying a ceramic coating composition to the buffer layer 250 to form the thermally conductive first ceramic layer (ceramic layer 151b or intermediate layer 311), and applying a ceramic coating composition to the first ceramic layer to form the light-reflective second ceramic layer (ceramic layer 151a or reflective layer 312).

A method for manufacturing a light-emitting device substrate according to a twentieth aspect of the present invention is a method for manufacturing the light-emitting device substrate (substrate 120a or 320) according to the tenth aspect. This method includes laminating a resin sheet containing ceramic particles on the base 100 or 302 to form the buffer layer 250, laminating another resin sheet containing ceramic particles on the buffer layer 250 to form the thermally conductive first ceramic layer (ceramic layer 151b or intermediate layer 311), and applying a ceramic coating composition to the first ceramic layer to form the light-reflective second ceramic layer (ceramic layer 151a or reflective layer 312).

The present invention is not limited to the foregoing embodiments; various modifications can be made within the scope of the claims, and embodiments having suitable combinations of technical means disclosed in different embodiments are included in the technical scope of the invention. Novel technical features can also be provided by combinations of technical means disclosed in the foregoing embodiments.

INDUSTRIAL APPLICABILITY

The present invention is applicable to light-emitting device substrates including a base made of a metal material and a ceramic-containing insulating layer that reflects light, light-emitting devices including such light-emitting device substrates, and methods for manufacturing such light-emitting device substrates.

REFERENCE SIGNS LIST 30, 301 light-emitting device
100, 302 base
110, 304 light-emitting element
120, 120a, 320 substrate (light-emitting device substrate)
150, 150a ceramic insulating layer (electrically insulating layer)
151a ceramic layer (second ceramic layer)
151b ceramic layer (first ceramic layer)
250 buffer layer
311 intermediate layer (first ceramic layer)
312 reflective layer (second ceramic layer)

The invention claimed is:

1. A light-emitting device substrate comprising:
a base comprising aluminum;
a thermally conductive, light-reflective electrically insulating layer; and
a buffer layer formed between the base and the electrically insulating layer and having a smaller linear expansion coefficient than the base, wherein
the buffer layer includes an alloy of nickel and aluminum.

2. The light-emitting device substrate according to claim 1, wherein the buffer layer has a larger linear expansion coefficient than the electrically insulating layer.

3. The light-emitting device substrate according to claim 1, wherein the electrically insulating layer includes an epoxy resin.

4. The light-emitting device substrate according to claim 1, wherein the electrically insulating layer includes a resin containing alumina particles.

5. The light-emitting device substrate according to claim 1, wherein the electrically insulating layer comprises a multilayer structure, the layers of the electrically insulating layer including a thermally conductive first ceramic layer that is in contact with the buffer layer and a light-reflective second ceramic layer that is farthest away from the buffer layer.

6. A method for manufacturing the light-emitting device substrate according to claim 5, comprising:
    forming the buffer layer on the base by thermal spraying or aerosol deposition (AD),
    applying a ceramic coating composition to the buffer layer to form the thermally conductive first ceramic layer, and
    applying a ceramic coating composition to the first ceramic layer to form the light-reflective second ceramic layer.

7. The light-emitting device substrate according to claim 1, wherein the buffer layer contains 90% or more by weight Ni.

8. The light-emitting device substrate according to claim 1, wherein the buffer layer has a thickness of 10 to 100 µm.

9. The light-emitting device substrate according to claim 1, wherein the electrically insulating layer is made of a resin containing ceramic particles.

10. A light-emitting device comprising:
    the light-emitting device substrate according to claim 1; and
    light-emitting element disposed on the electrically insulating layer.

11. A method for manufacturing the light-emitting device substrate according to claim 1, comprising:
    forming the buffer layer on the base by thermal spraying or aerosol deposition (AD); and
    applying a ceramic coating composition to the buffer layer to form the thermally conductive, light-reflective electrically insulating layer.

* * * * *